(12) United States Patent
Zhu et al.

(10) Patent No.: US 11,823,768 B2
(45) Date of Patent: Nov. 21, 2023

(54) DRIVE CIRCUIT AND MEMORY CHIP

(71) Applicant: CHANGXIN MEMORY TECHNOLOGIES, INC., Hefei (CN)

(72) Inventors: Lei Zhu, Hefei (CN); Jianyong Qin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 280 days.

(21) Appl. No.: 17/401,270

(22) Filed: Aug. 12, 2021

(65) Prior Publication Data

US 2022/0165316 A1 May 26, 2022

Related U.S. Application Data

(63) Continuation of application No. PCT/CN2021/105042, filed on Jul. 7, 2021.

(30) Foreign Application Priority Data

Nov. 25, 2020 (CN) .......................... 202011340226.8

(51) Int. Cl.
  *G11C 7/12* (2006.01)
  *H03K 17/567* (2006.01)

(52) U.S. Cl.
  CPC ............ *G11C 7/12* (2013.01); *H03K 17/567* (2013.01)

(58) Field of Classification Search
  CPC .............................. G11C 7/12; H03K 17/567
  USPC ................................................... 365/189.11
  See application file for complete search history.

(56) References Cited

U.S. PATENT DOCUMENTS

| | | | |
|---|---|---|---|
| 5,148,120 A | | 9/1992 | Kano et al. |
| 10,396,658 B2* | | 8/2019 | Chan ....................... H02M 1/32 |
| 2007/0182605 A1 | | 8/2007 | Westra et al. |
| 2014/0111266 A1* | | 4/2014 | Arslan ................... H03K 3/353 |
| | | | 327/333 |
| 2015/0279467 A1* | | 10/2015 | Conte ....................... H03F 1/14 |
| | | | 330/291 |
| 2017/0090493 A1 | | 3/2017 | Cui et al. |
| 2018/0138898 A1 | | 5/2018 | Nallamothu |

(Continued)

FOREIGN PATENT DOCUMENTS

| CN | 101826844 A | 9/2010 |
|---|---|---|
| CN | 106330104 A | 1/2017 |
| CN | 109560807 A | 4/2019 |

(Continued)

*Primary Examiner* — Muna A Techane
(74) *Attorney, Agent, or Firm* — KILPATRICK TOWNSEND & STOCKTON LLP

(57) ABSTRACT

A drive circuit and a memory chip are provided. The drive circuit includes: an amplification module, working under a first voltage domain; an output module, working under a second voltage domain, a power supply voltage of the second voltage domain being greater than a power supply voltage of the first voltage domain, and an output terminal of the output module being an output terminal of the drive circuit; a connection module, connected to an output terminal of the amplification module and an input terminal of the output module; and a feedback module, an input terminal of the feedback module being connected to the output terminal of the output module, and an output terminal of the feedback module being connected to an input terminal of the amplification module.

19 Claims, 7 Drawing Sheets

(56) References Cited

U.S. PATENT DOCUMENTS

2020/0373918 A1 * 11/2020 Ikeda .................... H02M 7/539

FOREIGN PATENT DOCUMENTS

| CN | 110581648 A | 12/2019 |
| EP | 1750271 A1 | 2/2007 |

* cited by examiner

DRIVE CIRCUIT AND MEMORY CHIP

CROSS-REFERENCE TO RELATED APPLICATION

The present disclosure is a continuation of PCT/CN2021/105042, filed on Jul. 7, 2021, which claims priority to Chinese Patent Application No. 202011340226.8, titled "DRIVE CIRCUIT AND MEMORY CHIP" and filed on Nov. 25, 2020, the entire contents of which are incorporated herein by reference.

TECHNICAL FIELD

The present disclosure relates to the field of integrated circuit manufacturing technologies, and more particularly, to a drive circuit working under a plurality of voltage domains, and a memory chip to which the drive circuit is applied.

BACKGROUND

In a dynamic random access memory (DRAM) analog circuit, a drive circuit with both pull-up capability and pull-down capability and lower power consumption needs to be provided in a high-voltage domain.

In the related technologies, to meet the requirements of the drive circuit for the pull-up capability and the pull-down capability, generally the drive circuit is provided to work in the high-voltage domain. However, in the DRAM, a voltage source in the high-voltage domain is generated by a charge pump and has an efficiency of lower than 50%, and thus this drive circuit generally has higher power consumption. To reduce the power consumption, in the related technologies, it is also adopted a solution where the drive circuit is provided to work in a low-voltage domain. However, the drive circuit of this solution can only provide the pull-down capability, and cannot meet the requirements of the drive circuit for the pull-up capability, and thus this solution cannot meet requirements for accuracy of an output voltage of the drive circuit.

It is to be noted that the information disclosed in the above background art section is only for enhancement of understanding of the background of the present disclosure, and therefore may contain information that does not constitute the prior art that is already known to a person of ordinary skill in the art.

SUMMARY

An objective of the present disclosure is to provide a drive circuit working under a plurality of voltage domains and a memory chip to which the drive circuit is applied, to overcome, at least to a certain extent, problems such as insufficient accuracy of a drive voltage of the drive circuit, larger power consumption and insufficient drive capability caused by limitation and defects of related technologies.

According to a first aspect of the present disclosure, there is provided a drive circuit. The drive circuit includes: an amplification module working under a first voltage domain; an output module working under a second voltage domain, wherein a power supply voltage of the second voltage domain is greater than a power supply voltage of the first voltage domain, and an output terminal of the output module is an output terminal of the drive circuit; a connection module, connected to an output terminal of the amplification module and an input terminal of the output module; and a feedback module, wherein an input terminal of the feedback module is connected to the output terminal of the output module, and an output terminal of the feedback module is connected to an input terminal of the amplification module.

According to a second aspect of the present disclosure, there is provided a memory, which includes the aforementioned drive circuit.

In some embodiments of the present disclosure, the amplification module at an input terminal of the drive circuit is provided in a low-voltage domain, and the output module is provided in a high-voltage domain, such that power consumption of the drive circuit can be effectively reduced while ensuring pull-up and pull-down capabilities of the drive circuit. The feedback module connected to the two voltage domains is employed to sample output of the high-voltage domain and to feed back the output of the high-voltage domain to an input module in the low-voltage domain, such that accuracy of an output voltage of the drive circuit can be effectively controlled. In this way, the power consumption of the drive circuit can be reduced while ensuring the drive capabilities of the drive circuit and meeting the requirements for higher accuracy of a drive voltage of the drive circuit.

It is to be understood that the above general description and the detailed description below are merely exemplary and explanatory, and do not limit the present disclosure.

BRIEF DESCRIPTION OF THE DRAWINGS

The accompanying drawings herein are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

Figure 1:
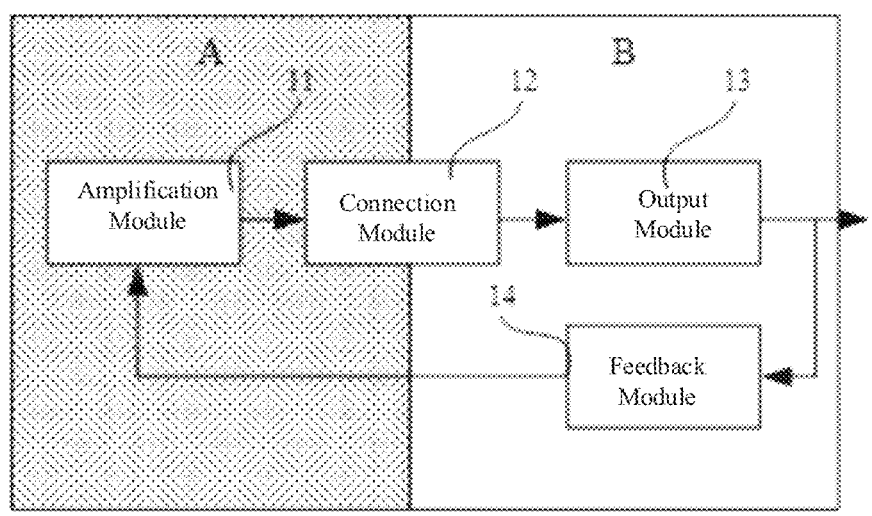
FIG. 1 illustrates a schematic diagram of a drive circuit according to an exemplary embodiment of the present disclosure.

Exemplary embodiments will now be described more comprehensively with reference to the accompanying drawings. However, the exemplary embodiments can be embodied in many forms and should not be construed as limited to the embodiments set forth herein; rather, these embodiments are provided so that the present disclosure will be made thorough and complete, and the concept of exemplary embodiments will be fully conveyed to those skilled in the art. Furthermore, the described features, structures, or characteristics may be combined in any suitable manner in one or more embodiments. In the following description, numerous details are provided to provide a thorough understanding of the embodiments of the present disclosure. Those skilled in the art will recognize, however, that the technical solution of the present disclosure may be practiced without one or more of the details described, or that other methods, components, devices, steps and so on may be employed. In other instances, well-known technical solutions are not shown or described in detail to avoid obscuring aspects of the present disclosure.

Furthermore, the accompanying drawings are merely schematic illustrations of the present disclosure. Same or similar parts are denoted by same reference numbers in the drawings and, thus, a detailed description thereof will be omitted. Some block diagrams shown in the figures are functional entities and not necessarily to be corresponding to a physically or logically individual entities. These functional entities may be implemented in software form, or implemented in one or more hardware modules or integrated circuits, or implemented in different networks and/or processor apparatuses and/or microcontroller apparatuses.

A detailed description of the exemplary embodiments of the present disclosure will be made in the following with reference to the accompanying drawings.

FIG. 1 illustrates a schematic structural diagram of a drive circuit according to an exemplary embodiment of the present disclosure.

Referring to FIG. 1, the drive circuit 100 may include:
an amplification module 11, working under a first voltage domain A;
an output module 13 working under a second voltage domain B, wherein a power supply voltage V2 of the second voltage domain B is greater than a power supply voltage V1 of the first voltage domain A, and an output terminal of the output module 13 is an output terminal of the drive circuit 100;
a connection module 12, connected to an output terminal of the amplification module 11 and an input terminal of the output module 13; and
a feedback module 14, wherein an input terminal of the feedback module 14 is connected to the output terminal of the output module 13, and an output terminal of the feedback module 14 is connected to an input terminal of the amplification module 11.

In the embodiment as shown in FIG. 1, the amplification module 11 works in the first voltage domain A at a lower voltage, such that the overall power consumption of the drive circuit 100 can be reduced. The output module 13 works in the second voltage domain B at a higher voltage B, such that the pull-up capability and the pull-down capability of the drive circuit 100 can be guaranteed. An output voltage of the output module 13 may be controlled by an output voltage of the amplification module 11 by means of the connection module 12. The output voltage of the output module 13 in the second voltage domain B can be fed back, by the feedback module 14, to the input terminal of the amplification module 11 in the first voltage domain A for feedback adjustment, such that accuracy of an output voltage of the drive circuit 100 can be effectively improved while meeting the requirements of the drive circuit 100 for the pull-up capability and the pull-down capability, lower power consumption and higher accuracy of the drive voltage.

Each exemplary embodiment of the drive circuit 100 is introduced below. The embodiments provided in the following drawings of the present disclosure are merely exemplary. In practical applications, those skilled in the art can set detailed circuit structures, component types and component parameters according to the architecture as shown in FIG. 1 and the following exemplary embodiments, and the present disclosure is not limited thereto.

Figure 2:
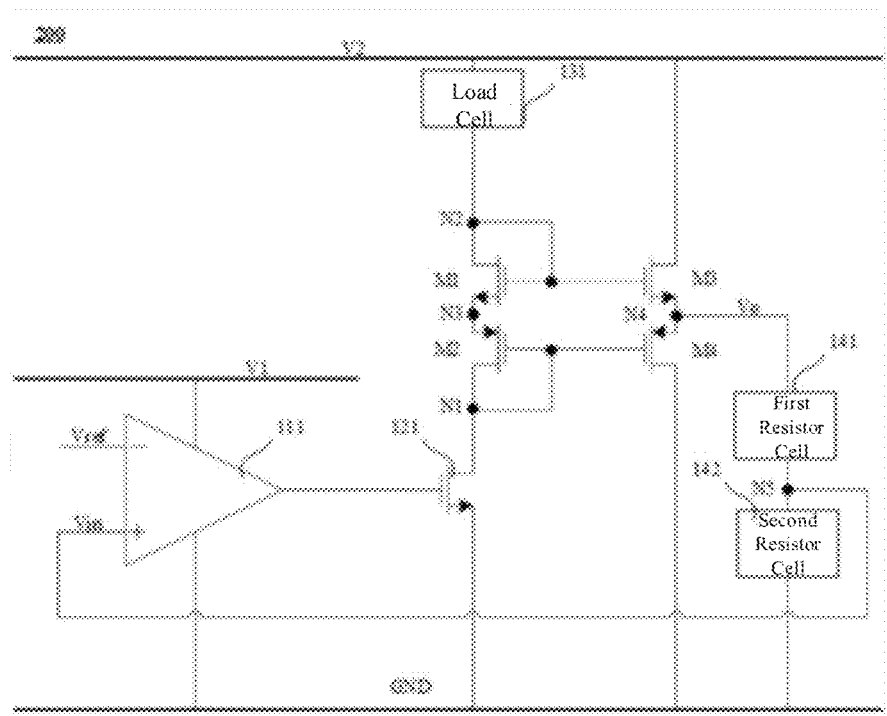
FIG. 2 illustrates a schematic diagram of a drive circuit according to a first embodiment of the present disclosure.

FIG. 2 illustrates a schematic diagram of a drive circuit according to a first embodiment of the present disclosure.

Referring to FIG. 2, in the drive circuit 200, implementations of each module may be a combination as follows.

The amplification module 11 is implemented by, for example, an error amplifier 111.

The connection module 12 may be an N-type common-source transistor 121. A gate of the N-type common-source transistor 121 is connected to an output terminal of the error amplifier 111, a drain of the N-type common-source transistor 121 and the input terminal of the output module 13 are connected to a first node N1, and a source of the N-type common-source transistor 121 is grounded. In this case, a non-inverting input terminal of the error amplifier 111 is connected to the output terminal of the feedback module 14, and an inverting input terminal of the error amplifier 111 is connected to a reference voltage Vref.

The feedback module 14 may be implemented by means of, for example, a resistive divider circuit. The resistive divider circuit may include, for example, a first resistor cell 141 and a second resistor cell 142. A first terminal of the first resistor cell 141 is connected to a fourth node N4, and a second terminal of the first resistor cell 141 is connected to a fifth node N5. A first terminal of the second resistor cell 142 is connected to the fifth node N5, and a second terminal of the second resistor cell 142 is grounded. The fourth node N4 is the output terminal of the output module 13, the fifth node N5 is the output terminal of the feedback module 14, and the fifth node N5 is connected to the input terminal of the amplification module 11. Both the first resistor cell 141 and the second resistor cell 142 may be implemented by means of one or more resistive elements, which is not limited in the present disclosure.

In some other embodiments, the feedback module 14 may also be implemented by means of a capacitive divider circuit. The capacitive divider circuit may include, for example, a first capacitor cell (not shown) and a second capacitor cell (not shown). A first terminal of the first capacitor cell is connected to the fourth node N4, a second terminal of the first capacitor cell is connected to the fifth node N5. A first terminal of the second capacitor cell is connected to the fifth node N5, and a second terminal of the second capacitor cell is grounded. Both the first capacitor cell and the second capacitor cell may be implemented by means of one or more capacitors connected in series or in parallel, which is not limited in the present disclosure.

The output module 13 may be implemented by means of an AB source follower. The AB source follower is a type of power amplifier circuit. The power amplifier circuits may be classified into six categories. Category A circuits are configured to directly modulate a power source. Category B circuits are similar to emitter followers and commonly employ push-pull structures. Category AB circuits are combinations of the Category A circuits and the Category B circuits.

In the embodiment as shown in FIG. 2, the output module 13 may include a load cell 131, a first transistor M1, a second transistor M2, a third transistor M3 and a fourth transistor M4 to implement the AB source follower.

Two terminals of the load cell 131 are respectively connected to a second voltage V2 corresponding to the second voltage domain and a second node N2. The first transistor M1 is an N-type transistor, wherein a gate a drain of the first transistor M1 are both connected to the second node N2, and a source of the first transistor M1 is connected to a third node N3. The second transistor M2 is a P-type transistor, wherein a gate and a drain of the second transistor M2 are both connected to the first node N1, and a source of the second transistor M2 is connected to the third node N3. The third transistor M3 constitutes a source follower configured to provide a pull-up function. A gate of the third transistor M3 is connected to the second node N2, a drain of the third transistor M3 is connected to the second voltage V2, and a source of the third transistor M3 is connected to the fourth node N4. The fourth node N4 is the output terminal of the output module 13 and the output terminal of the drive circuit 100. The gate of the third transistor M3 is controlled by a voltage variation output source voltage Vo of the second node N2, to provide a pull-up voltage to the fourth node N4. The fourth transistor M4 constitutes a source follower configured to provide a pull-down function, a gate of the fourth transistor M4 is connected to the first node N1, a drain of the fourth transistor M4 is grounded, and a source of the fourth transistor M4 is connected to the fourth node N4. The gate of the fourth transistor M4 is controlled by a voltage variation output source voltage of the first node N1, to provide a pull-down voltage to the fourth node N4. The third transistor M3 and the fourth transistor M4 interact with each other to provide an output circuit having a higher input impedance and a lower output impedance.

As shown in FIG. 2, when the amplification module 11 includes the error amplifier 111, the connection module 12 is implemented by the N-type common-source transistor, the output module 13 is implemented by the AB source follower, and the feedback module 14 is implemented by the resistive divider circuit, the non-inverting input terminal of the error amplifier 111 is connected to the fifth node N5, and the inverting input terminal of the error amplifier 111 is connected to a reference voltage.

The reference voltage connected to the inverting input terminal of the error amplifier 111 may be determined according to a ratio of the first resistor cell 141 to the second resistor cell 142. Assuming that a target output voltage of the output terminal of the output module 13 is Vt (Vt is not necessarily equal to an actual output voltage Vo), a resistance of the first resistor cell 141 is R1, and a resistance of the second resistor cell 142 is R2, the reference voltage Vref connected to the inverting input terminal of the error amplifier 111 may be expressed by a formula as below:

$$Vref = \frac{Vt \cdot R2}{R1 + R2} \quad (1)$$

When the output voltage Vo of the fourth node N4 fluctuates due to external load fluctuation and is not equal to Vt, a voltage of the fifth node N5 (i.e., an input voltage Vin of the non-inverting input terminal of the error amplifier 111) may be expressed by a formula as below:

$$Vin = \frac{Vo \cdot R2}{R1 + R2} \quad (2)$$

Thus, the two input terminals of the error amplifier 111 have a voltage difference, and the voltage difference acts on the gate of the N-type common-source transistor 121 by means of the output terminal of the error amplifier 111, thereby causing a voltage variation of the first node N1.

Further, the voltage variation directly acts on the gate of the fourth transistor M4, thereby causing source voltage variation of the fourth transistor M4, i.e., variation of the output voltage Vo.

When Vo is greater than Vt, the voltage of the fifth node N5 increases, the voltage at the non-inverting input terminal of the error amplifier 111 is greater than the voltage at the inverting input terminal of the error amplifier 111, the output voltage of the error amplifier 111 (i.e., a gate voltage of the N-type common-source transistor 121) rises, and a drain voltage of the N-type common-source transistor 121 (i.e., the voltage of the first node N1) drops, which causes a gate-source voltage difference of the fourth transistor M4 (Vgs of M4) to increase, and a source voltage of the fourth transistor M4 (i.e., the voltage Vo of the fourth node N4) to drop. Meanwhile, voltage drop of the first node N1 causes the voltage of the second node N2 (i.e., the gate voltage of the third transistor M3) to drop, thereby causing the source voltage of the third transistor M3 (i.e., the voltage Vo of the fourth node N4) to drop. Under the double action, the voltage Vo of the fourth node N4 drops, causing the voltage Vin of the fifth node N5 to drop, which is fed back to the input terminal of the error amplifier 111. It is repeated in this way until Vo is equal to Vt again, the voltages of the two input terminals of the error amplifier 111 are equal, and the voltage of each node is stabilized. In this way, the circuit 200 automatically implements adjustment of the output voltage Vo.

When Vo is less than Vt, the voltage of the fifth node N5 decreases, the voltage at the non-inverting input terminal of the error amplifier 111 is less than the voltage at the inverting input terminal of the error amplifier 111, the output voltage of the error amplifier 111 (i.e., the gate voltage of the N-type common-source transistor 121) drops, the drain voltage of the N-type common-source transistor 121 (i.e., the voltage of the first node N1) rises, and a source voltage of the fourth transistor M4 (i.e., the voltage Vo of the fourth node N4) rises. Meanwhile, the voltage of the second node N2 rises, and the source voltage of the third transistor M3 (i.e., the voltage Vo of the fourth node N4) rises. Under the double action, the voltage of the fourth node N4 rises, and is fed back to the non-inverting input terminal of the error amplifier 111 by means of the fifth node N5. It is repeated in this way until Vo is equal to Vt again, the voltages of the two input terminals of the error amplifier 111 are equal, and the voltage of each node is stabilized. In this way, the circuit 200 automatically implements the adjustment of the output voltage Vo.

In some embodiments of the present disclosure, the load cell 131, the first transistor M1 and the second transistor M2 together provide a bias voltage to the third transistor M3 and the fourth transistor M4. Therefore, the load cell 131 not only can serve as a current source with its first terminal connected to the second voltage V2 and its second terminal connected to the second node N2, but also can serve as a load resistor (the load resistor may be implemented by means of one resistor or may be formed by a plurality of resistors connected in series and/or in parallel). A form of the load cell 131 may be set by those skilled in the art according to actual needs, and no restriction is imposed on this in the present disclosure.

Figure 3:
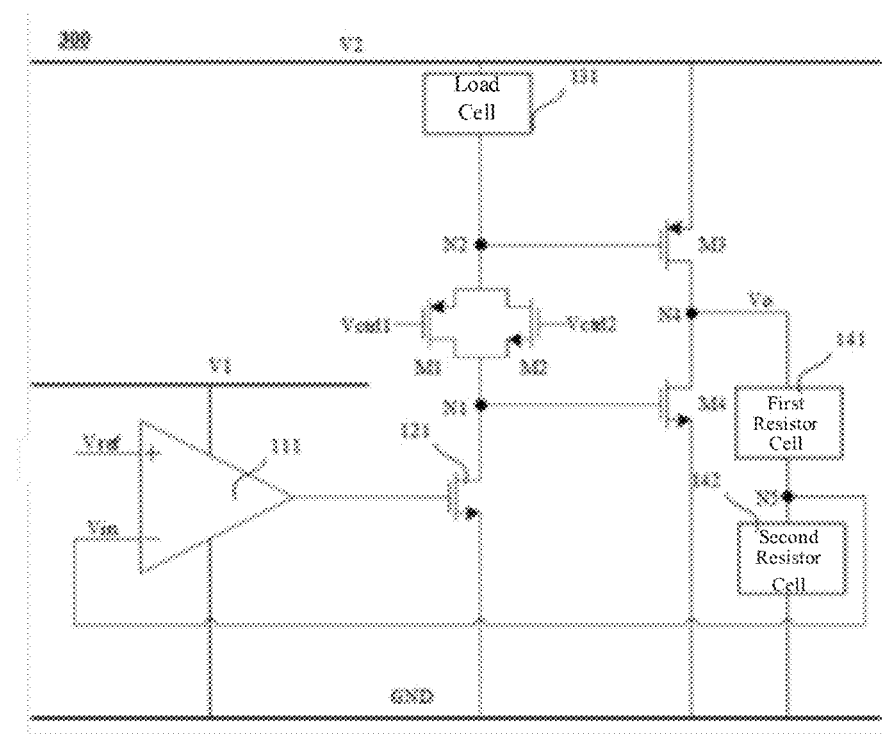
FIG. 3 illustrates a schematic diagram of a drive circuit according to a second embodiment of the present disclosure.

FIG. 3 illustrates a circuit diagram of a drive circuit according to a second embodiment of the present disclosure.

With reference to FIG. 3, the amplification module 11, connection module 12 and the feedback module 14 in the drive circuit 300 are in the same form as those in the drive circuit 200, and the output module 13 may be implemented by means of the AB push-pull output circuit. In this case, the non-inverting input terminal of the error amplifier 111 is connected to the reference voltage Vref, and the inverting input terminal of the error amplifier 111 is connected to the fifth node N5.

In the embodiment as shown in FIG. 3, the output module 13 includes a first transistor M1, a second transistor M2, a third transistor M3, and a fourth transistor M4. The first transistor M1 is a P-type transistor, wherein a gate of the first transistor M1 is connected to a first control signal Vctrl1, a source of the first transistor M1 is connected to the second node N2, and a drain of the first transistor M1 is connected to the first node N1. The second transistor M2 is an N-type transistor, wherein a gate of the second transistor M2 is connected to a second control signal Vctrl2, a drain of the second transistor M2 is connected to the second node N2, and a source of the second transistor M2 is connected to the first node N1. The third transistor M3 is a P-type transistor, wherein a gate of the third transistor M3 is connected to the second node N2, a source of the third transistor M3 is connected to the second voltage V2, and a drain of the third transistor M3 is connected to the fourth node N4, i.e., the output terminal of the output module 13 and the output terminal of the drive circuit 300. The fourth transistor M4 is an N-type transistor, wherein a gate of the fourth transistor M4 is connected to the first node N1, a source of the fourth transistor M4 is grounded, and a drain of the fourth transistor M4 is connected to the fourth node N4, i.e., the output terminal of the output module 13 and the output terminal of the drive circuit 300.

The first control signal Vctrl1 may be calculated out according to a parameter of the first transistor M1 and the target output voltage Vt, such that an accurate bias voltage is provided to the gate of the third transistor M3 by means of the source of the first transistor M1, and further, the drain voltage Vo of the third transistor M3 is set as the target output voltage Vt. The second control signal Vctrl2 may be calculated out according to a parameter of the second transistor M2 and the target output voltage Vt, such that an accurate bias voltage is provided to the gate of the fourth transistor M4 by means of the source of the second transistor M2, and further, the drain voltage Vo of the fourth transistor M4 is set as the target output voltage Vt.

In the drive circuit 300, when the voltage of the fourth node N4 (i.e., the output voltage Vo) is greater than the preset voltage Vt, the voltage of the fifth node N5 rises, the voltage of the non-inverting input terminal of the error amplifier 111 is lower than the voltage of the inverting input terminal of the error amplifier 111, the output voltage of the error amplifier 111 (i.e., the gate voltage of the N-type common-source transistor 121) drops, the drain voltage of the N-type common-source transistor 121 (i.e., the voltage of the first node N1) rises, and the drain voltage Vo of the fourth transistor M4 drops. Meanwhile, the voltage of the first node N1 is transferred to the second node N2 by means of the first transistor M1 and the second transistor M2, the gate voltage of the third transistor M3 rises, and the drain voltage Vo of the third transistor M3 drops. Thus, the drive circuit 300 implements a reverse regulation of the output voltage Vo when the output voltage Vo rises. Similarly, when the output voltage Vo is less than the preset voltage Vt, the voltage of the fifth node N5 drops, the gate voltage of the N-type common-source transistor 121 rises, the voltage of the first node N1 and the voltage of the second node N2 drop synchronously, and the drain voltage of the fourth transistor M4 and the drain voltage of the third transistor M3 rise. In this way, the drive circuit 300 implements a reverse regulation of the output voltage Vo when the output voltage Vo drops.

Compared with the drive circuit 200, the drive circuit 300 employs the first control signal Vctrl1 and the second control signal Vctrl2 to provide a static bias voltage to the third transistor M3 and the fourth transistor M4 respectively by means of the first transistor M1 and the second transistor M2. Thus, the voltage Vo of the fourth node N4 can be more accurately set as the target output voltage Vt.

Figure 4:
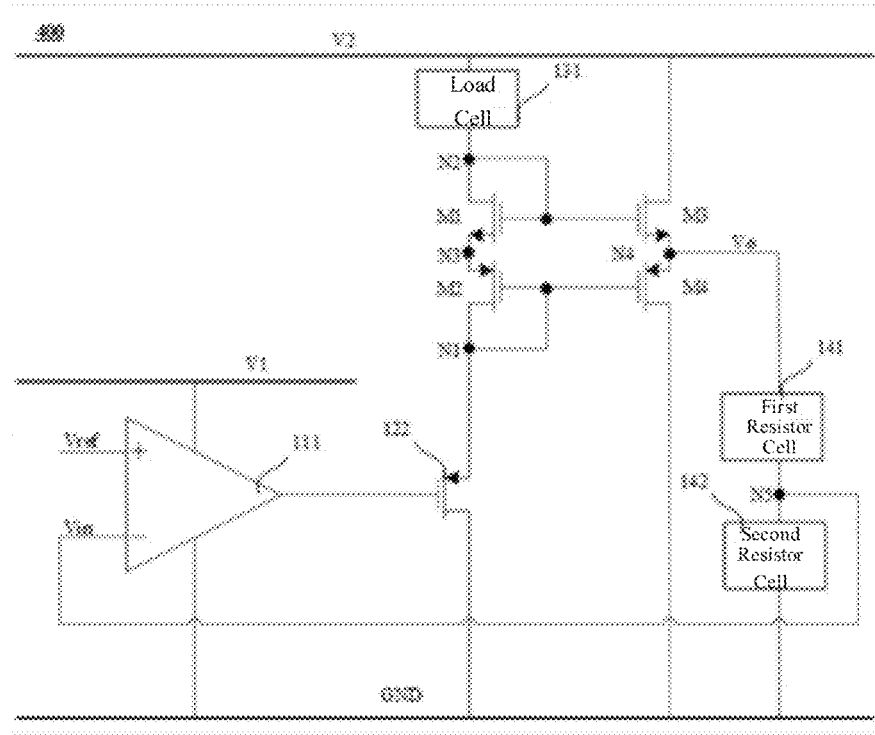
FIG. 4 illustrates a schematic diagram of a drive circuit according to a third embodiment of the present disclosure.

FIG. 4 illustrates a circuit diagram of a drive circuit according to a third embodiment of the present disclosure.

With reference to FIG. 4, in the drive circuit 400, the amplification module 11 is implemented by means of the error amplifier 111, the connection module 12 is implemented by means of a P-type common-drain transistor 122, the output module 13 is implemented by means of the AB source follower circuit, and the feedback module 14 is implemented by means of a resistive divider feedback circuit. Correspondingly, the non-inverting input terminal of the error amplifier 111 is connected to the reference voltage Vref, and the inverting input terminal of the error amplifier 111 is connected to the fifth node N5.

Similar to the drive circuit 200, when the voltage Vo of the fourth node N4 rises, the voltage of the fifth node N5 (i.e., the inverting input terminal of the error amplifier 111) rises accordingly, the output voltage of the error amplifier 111 (i.e., the gate voltage of the P-type common-drain transistor 122) drops, the source voltage of the P-type common-drain transistor 122 (i.e., the voltage of the first node N1) drops. In addition, affected by decrease of the gate voltage of the P-type common-drain transistor 122, the source voltage Vo of the fourth transistor M4 drops. Meanwhile, the voltage of the second node N2 drops, and affected by decrease of the gate voltage of the P-type common-drain transistor 122, the source voltage Vo of the third transistor M3 drops. When the voltage Vo of the fourth node N4 drops, variations of the voltage of each node are contrary to the above description, and thus the details are not described again in the present disclosure. In this way, the drive circuit 400 implements a reverse regulation of the output voltage Vo when the output voltage Vo changes.

Figure 5:
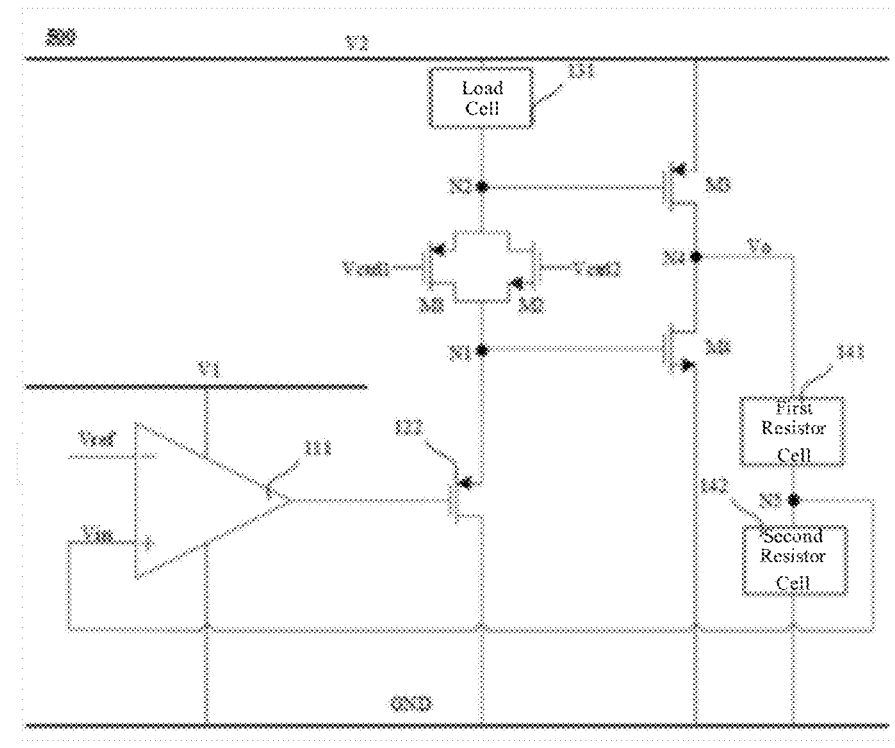
FIG. 5 illustrates a schematic diagram of a drive circuit according to a fourth embodiment of the present disclosure.

FIG. 5 illustrates a circuit diagram of a drive circuit according to a fourth embodiment of the present disclosure.

With reference to FIG. 5, in the drive circuit 500, the amplification module 11 is implemented by means of the error amplifier 111, the connection module 12 is implemented by means of the P-type common-drain transistor 122, the output module 13 is implemented by means of the AB push-pull output circuit, and the feedback module 14 is implemented by means of the resistive divider feedback circuit. Different from the drive circuit 400, in the drive circuit 500, the inverting input terminal of the error amplifier 111 is connected to the reference voltage Vref, and the non-inverting input terminal of the error amplifier 111 is connected to the fifth node N5.

When the output voltage Vo rises and the voltage of the fifth node N5 rises, the output voltage of the error amplifier 111 rises, the source voltage of the P-type common-drain transistor 122 rises, and affected by the rise of the gate voltage, the drain voltage Vo of the fourth transistor M4 drops. Meanwhile, the voltage of the second node N2 rises, and affected by the rise of the gate voltage, the drain voltage Vo of the third transistor M3 drops. When the voltage Vo of the fourth node N4 drops, variations of the voltage of each node are contrary to the above description, and thus the details are not described again in the present disclosure. In this way, the drive circuit 500 implements a reverse regulation of the output voltage Vo when the output voltage Vo changes.

Figure 6:
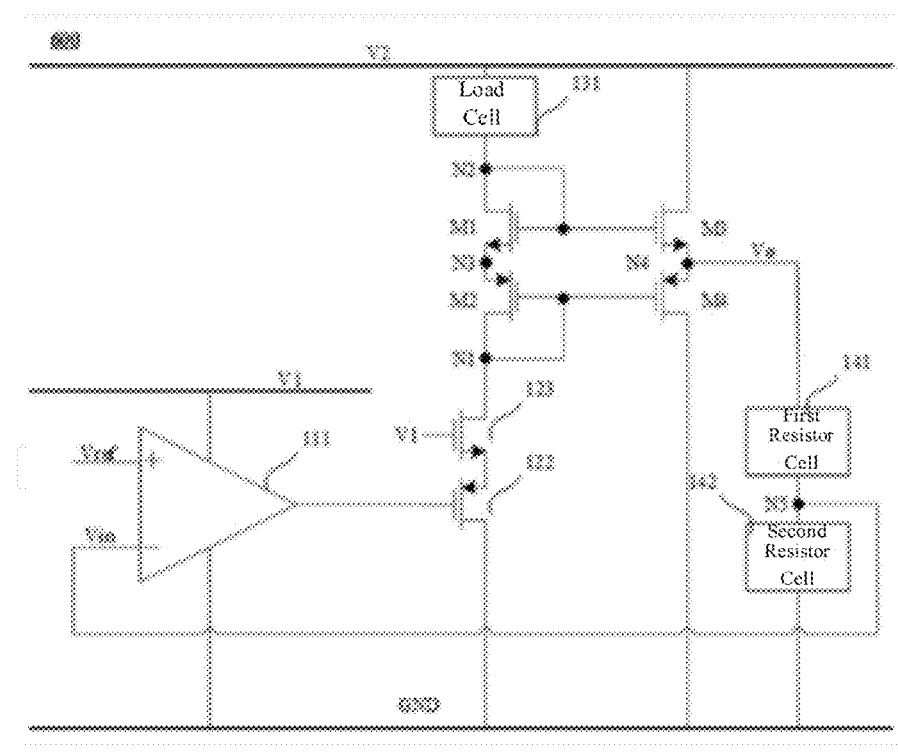
FIG. 6 illustrates a schematic diagram of a drive circuit according to a fifth embodiment of the present disclosure.

FIG. 6 illustrates a circuit diagram of a drive circuit according to a fifth embodiment of the present disclosure.

With reference to FIG. 6, in the drive circuit 600, the amplification module 11 is implemented by means of the error amplifier 111, the output module 13 is implemented by means of the AB source follower circuit, and the feedback module 14 is implemented by means of the resistive divider feedback circuit. The connection module 12 includes the P-type common-drain transistor 122 and an N-type common-gate transistor 123. A gate of the P-type common-drain transistor 122 is connected to the output terminal of the error amplifier 111, a drain of the P-type common-drain transistor 122 is grounded, and a source of the P-type common-drain transistor 122 is connected to a source of the N-type common-gate transistor 123. A drain of the N-type common-gate transistor 123 is connected to the first node N1, and a gate of the N-type common-gate transistor 123 is connected to the first voltage V1. The P-type common-drain transistor 122 and the N-type common-gate transistor 123 jointly form a common-drain common-gate structure, which can increase a loop gain, with a principle as follows:

Supposing transconductance of the P-type common-drain transistor 122 is gm1, transconductance of the N-type common-gate transistor 123 is gm2, and transconductance of a structure obtained after the P-type common-drain transistor 122 and the N-type common-gate transistor 123 are connected is GM, a formula may be obtained as below:

$$1/GM = 1/gm1 + 1/gm2 \quad (3)$$

In this way, two-stage gains may be implemented, such that control accuracy of the voltage of the first node N1 can be effectively improved based on the output voltage of the same error amplifier 111, thereby improving the control accuracy of the output voltage Vo.

In this case, the non-inverting input terminal of the error amplifier 111 is connected to the reference voltage Vref, and the inverting input terminal of the error amplifier 111 is connected to the fifth node N5.

When the voltage Vo of the fourth node N4 rises, the input voltage of the inverting input terminal of the error amplifier 111 rises, and the output voltage of the output terminal of the error amplifier 111 drops. Affected by the decrease of the gate voltage, the source voltage of the P-type common-drain transistor 122 drops. The source voltage of the P-type common-drain transistor 122 is transferred to the first node N1 by means of the N-type common-gate transistor 123, causing the voltage of the first node N1 to drop and the voltage of the second node N2 to drop. Respectively affected by the decrease of the gate voltage, the source voltage Vo of the third transistor M3 and the source voltage Vo of the fourth transistor M4 drop. When the voltage Vo of the fourth node N4 drops, variations of the voltage of each node are contrary to the above description, and thus the details are not described again in the present disclosure. In this way, the drive circuit 600 implements a reverse regulation of the output voltage Vo when the output voltage Vo changes.

Figure 7:
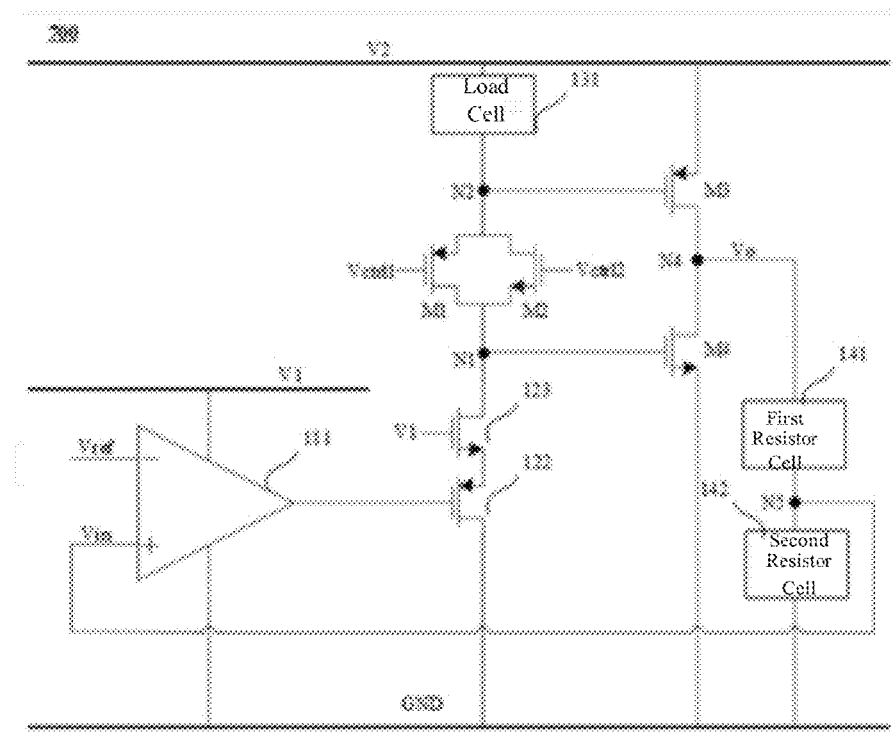
FIG. 7 illustrates a schematic diagram of a drive circuit according to a sixth embodiment of the present disclosure.

FIG. 7 illustrates a circuit diagram of a drive circuit according to a sixth embodiment of the present disclosure.

With reference to FIG. 7, in the drive circuit 700, the amplification module 11 is implemented by means of the error amplifier 111, the connection module 12 is implemented by means of the P-type common-drain transistor 122 and the N-type common-gate transistor 123, the output module 13 is implemented by means of the AB push-pull output circuit, and the feedback module 14 is implemented by means of the resistive divider feedback circuit.

In this case, the non-inverting input terminal of the error amplifier 111 is connected to the fifth node N5, and an inverting input terminal of the error amplifier 111 is connected to the reference voltage Vref.

When the output voltage Vo rises, the voltage of the fifth node N5 (i.e., the non-inverting input terminal of the error amplifier 111) rises, and the output voltage rises. Affected by the rise of the gate voltage, the source voltage of the P-type common-drain transistor 122 rises. The source voltage of the P-type common-drain transistor 122 is transferred to the first node N1 by means of the N-type common-gate transistor 123, causing the voltage of the first node N1 to rise and the voltage of the second node N2 to rise. Respectively affected by the rise of the gate voltage, the drain voltage Vo of the third transistor M3 and the drain voltage Vo of the fourth transistor M4 drop. When the voltage Vo of the fourth node N4 drops, variations of the voltage of each node are contrary to the above description, and thus the details are not described again in the present disclosure. In this way, the drive circuit 700 implements a reverse regulation of the output voltage Vo when the output voltage Vo changes.

In the first embodiment to the sixth embodiment, variations of the output voltage Vo cause variations of the voltage across the input terminal of the error amplifier 111 (i.e., the fifth node N5, the output terminal of the feedback module 14), thereby causing variations of the output voltage of the error amplifier 111 (i.e., the input voltage of the connection module 12), and further causing variations of the voltage of the first node N1 by means of the connection module 12. The variations of the voltage of the first node N1 are transferred to the second node N2 by means of the first transistor M1 and the second transistor M2, such that the gate voltage of the third transistors M3 and the gate voltage of the fourth transistor M4 vary in the same direction, causing the variations of the output voltage Vo. It is repeated in this way until the non-inverting input terminal of the error amplifier 111 has the same voltage as the inverting input terminal of the error amplifier 111. At this moment, the output terminal of the error amplifier 111 no longer varies, and the voltage of the first node N1 and the voltage of the second node N2 (i.e., the gate voltages of the third transistor M3 and the gate voltages of the fourth transistor M4) no longer vary. In this way, stabilization of the voltage Vo of the fourth node N4 is achieved.

In the above-mentioned embodiments of the present disclosure, the connection module 12 may be implemented by means of the N-type common-source transistor 121, the P-type common-drain transistor 122, or the P-type common-drain transistor 122 and the N-type common-gate transistor 123. The output module 13 may be implemented by means of the AB source follower circuit or the AB push-pull output circuit. The feedback module 14 may be implemented by means of the resistive divider circuit or the capacitive divider circuit. The amplification module 11 may be implemented by means of the error amplifier 111, and a connection mode of the input terminal of error amplifier 111 is set based on actual circuit forms of the connection module 12 and the output module 13. Therefore, in addition to the above-mentioned embodiments, there are other combinations of the above-mentioned solutions in the present disclosure. Principles and connection relationships of implementation solutions corresponding to each module have been described in detail in the embodiments in FIGS. 2-7, and thus more solutions are not to be described in detail in the present disclosure.

It is to be understood that in addition to the above solutions, the amplification module 11, the connection module 12, the output module 13 and the feedback module 14 may also be implemented in other ways. Any drive circuit set according to the principles as shown in FIG. 1 falls within the protection scope of the present disclosure.

In conclusion, in the embodiments of the present disclosure, the amplification module 11 is arranged in the low-voltage domain, and the output module 13 is arranged in the high-voltage domain. The output voltage of the amplification module 11 is transferred to the output module 13 by means of the connection module 12, and the output voltage of the output module 13 is fed back to the input terminal of the amplification module 11 by means of the feedback module 14. In this way, power consumption of the drive circuit can be greatly reduced while ensuring pull-up and pull-down capabilities of the drive circuit and meeting the requirements of the drive circuit for larger drive capability, higher accuracy of the output voltage, and lower power consumption.

It is to be noticed that although a plurality of modules or cells of the device for action execution have been mentioned in the above detailed description, this partition is not compulsory. Actually, according to the embodiments of the present disclosure, features and functions of two or more modules or cells as described above may be embodied in one module or cell. Reversely, features and functions of one module or cell as described above may be further embodied in more modules or cells.

This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the claims.

INDUSTRIAL APPLICABILITY

In some embodiments of the present disclosure, the amplification module at an input terminal of the drive circuit is provided in a low-voltage domain, and the output module is provided in a high-voltage domain, such that power consumption of the drive circuit can be effectively reduced while ensuring pull-up and pull-down capabilities of the drive circuit. The feedback module connected to the two voltage domains is employed to sample output of the high-voltage domain and to feed back the output of the high-voltage domain to an input module in the low-voltage domain, such that accuracy of an output voltage of the drive circuit can be effectively controlled. In this way, the power consumption of the drive circuit can be reduced while ensuring the drive capabilities of the drive circuit and meeting the requirements for higher accuracy of a drive voltage of the drive circuit.

What is claimed is:

1. A drive circuit, comprising:
    an amplification module, working under a first voltage domain;
    an output module, working under a second voltage domain, a power supply voltage of the second voltage domain being greater than a power supply voltage of the first voltage domain, and an output terminal of the output module being an output terminal of the drive circuit;
    a connection module, connected to an output terminal of the amplification module and an input terminal of the output module; and
    a feedback module, an input terminal of the feedback module being connected to the output terminal of the output module, and an output terminal of the feedback module being connected to an input terminal of the amplification module.

2. The drive circuit according to claim 1, wherein the connection module comprises:
    an N-type common-source transistor, a gate thereof being connected to the output terminal of the amplification module, a drain thereof being connected to a first node, and a source thereof being grounded.

3. The drive circuit according to claim 1, wherein the connection module comprises:
    a P-type common-drain transistor, a gate thereof being connected to the output terminal of the amplification module, a source thereof being connected to a first node, and a drain thereof being grounded.

4. The drive circuit according to claim 1, wherein the connection module comprises:
    an N-type common-gate transistor, a gate thereof being connected to a first power supply voltage corresponding to the first voltage domain, and a drain thereof being connected to a first node; and
    a P-type common-drain transistor, a gate thereof being connected to the output terminal of the amplification module, a source thereof being connected to a source of the N-type common-gate transistor, and a drain thereof being grounded.

5. The drive circuit according to any one of claim 2, wherein the output module is implemented by means of an AB source follower.

6. The drive circuit according to claim 5, wherein the output module comprises:
    a load cell, a first terminal thereof being connected to a second power supply voltage corresponding to the second voltage domain, and a second terminal thereof being connected to a second node;
    a first transistor, being an N-type transistor, a drain and a gate of the first transistor both being connected to the second node, and a source of the first transistor being connected to a third node;
    a second transistor, being a P-type transistor, a source of the second transistor being connected to the third node, and a drain and a gate of the second transistor both being connected to the first node;
    a third transistor, being an N-type transistor, a gate of the third transistor being connected to the second node, a drain of the third transistor being connected to the second power supply voltage, a source of the third transistor being connected to a fourth node, and the fourth node being the output terminal of the output module; and
    a fourth transistor, being a P-type transistor, a gate of the fourth transistor being connected to the first node, a source of the fourth transistor being connected to the fourth node, and a drain of the fourth transistor being grounded.

7. The drive circuit according to any one of claim 2, wherein the output module is implemented by means of AB push-pull output.

8. The drive circuit according to claim 7, wherein the output module comprises:
    a load cell, a first terminal thereof being connected to a second power supply voltage corresponding to the second voltage domain, and a second terminal thereof being connected to a second node;

a first transistor, being a P-type transistor, a source of the first transistor being connected to the second node, a drain of the first transistor being connected to the first node, a gate of the first transistor being connected to a first control signal, and the first control signal being configured for providing a bias voltage to the first transistor;

a second transistor, being an N-type transistor, a drain of the second transistor being connected to the second node, a source of the second transistor being connected to the first node, a gate of the second transistor being connected to a second control signal, and the second control signal being configured for providing a bias voltage to the second transistor;

a third transistor, being a P-type transistor, a gate of the third transistor being connected to the second node, a source of the third transistor being connected to the second power supply voltage, a drain of the third transistor being connected to a fourth node, and the fourth node being the output terminal of the output module; and a fourth transistor, being an N-type transistor, a gate of the fourth transistor being connected to the first node, a drain of the fourth transistor being connected to the fourth node, and a source of the fourth transistor being grounded.

9. The drive circuit according to claim 6, wherein the load cell comprises:

a current source, an input terminal thereof being connected to the second power supply voltage, and an output terminal thereof being connected to the second node.

10. The drive circuit according to claim 6, wherein the load cell comprises:

a load resistor, a first terminal thereof being connected to the second power supply voltage, and a second terminal thereof being connected to the second node.

11. The drive circuit according to claim 1, wherein the feedback module is a resistive divider circuit.

12. The drive circuit according to claim 11, wherein the resistive divider circuit comprises:

a first resistor cell, a first terminal thereof being connected to a fourth node, and a second terminal thereof being connected to a fifth node; and a second resistor cell, a first terminal thereof being connected to the fifth node, and a second terminal thereof being grounded;

wherein the fourth node is the output terminal of the output module, the fifth node being the output terminal of the feedback module, and the fifth node being connected to the input terminal of the amplification module.

13. The drive circuit according to claim 1, wherein the feedback module is a capacitive divider circuit.

14. The drive circuit according to claim 13, wherein the feedback module comprises:

a first capacitor cell, a first terminal thereof being connected to a fourth node, and a second terminal thereof being connected to a fifth node; and a second capacitor cell, a first terminal thereof being connected to the fifth node, and a second terminal thereof being grounded;

wherein the fourth node is the output terminal of the output module, the fifth node being the output terminal of the feedback module, and the fifth node being connected to the input terminal of the amplification module.

15. The drive circuit according to claim 2, wherein the amplification module comprises:

an error amplifier;

when the output module is implemented by means of an AB source follower, a non-inverting input terminal of the error amplifier is connected to the output terminal of the feedback module, and an inverting input terminal of the error amplifier being connected to a reference voltage; and when the output module is implemented by means of AB push-pull output, the inverting input terminal of the error amplifier is connected to the output terminal of the feedback module, and the non-inverting input terminal of the error amplifier being connected to the reference voltage.

16. The drive circuit according to claim 3, wherein the amplification module comprises:

an error amplifier;

when the output module is implemented by means of an AB source follower, an inverting input terminal of the error amplifier is connected to the output terminal of the feedback module, and a non-inverting input terminal of the error amplifier being connected to a reference voltage; and when the output module is implemented by means of AB push-pull output, the non-inverting input terminal of the error amplifier is connected to the output terminal of the feedback module, and the inverting input terminal of the error amplifier being connected to the reference voltage.

17. The drive circuit according to claim 12, wherein a reference voltage of the amplification module is determined according to a ratio of a resistance value of the first resistor cell to a resistance value of the second resistor cell.

18. The drive circuit according to claim 14, wherein a reference voltage of the amplification module is determined according to a ratio of a capacitance value of the first capacitor cell to a capacitance value of the second capacitor cell.

19. A memory chip comprising a drive circuit, wherein the drive circuit comprises:

an amplification module, working under a first voltage domain;

an output module, working under a second voltage domain, a power supply voltage of the second voltage domain being greater than a power supply voltage of the first voltage domain, and an output terminal of the output module being an output terminal of the drive circuit;

a connection module, connected to an output terminal of the amplification module and an input terminal of the output module; and a feedback module, an input terminal of the feedback module being connected to the output terminal of the output module, and an output terminal of the feedback module being connected to an input terminal of the amplification module.

* * * * *